United States Patent
Guan et al.

(10) Patent No.: US 10,756,219 B2
(45) Date of Patent: Aug. 25, 2020

(54) TEXTURING METHOD FOR DIAMOND WIRE CUT POLYCRYSTALLINE SILICON SLICE

(71) Applicant: NANJING TECH UNIVERSITY, Nanjing (CN)

(72) Inventors: Zisheng Guan, Nanjing (CN); Jun Li, Nanjing (CN); Zhimei Shen, Nanjing (CN); Chunhua Lu, Nanjing (CN); Zhongzi Xu, Nanjing (CN)

(73) Assignee: NANJING TECH UNIVERSITY, Nanjing (CN)

( * ) Notice: Subject to any disclaimer, the term of this patent is extended or adjusted under 35 U.S.C. 154(b) by 14 days.

(21) Appl. No.: 16/081,864

(22) PCT Filed: Sep. 20, 2016

(86) PCT No.: PCT/CN2016/099441
§ 371 (c)(1),
(2) Date: Aug. 31, 2018

(87) PCT Pub. No.: WO2017/185592
PCT Pub. Date: Nov. 2, 2017

(65) Prior Publication Data
US 2019/0067496 A1 Feb. 28, 2019

(30) Foreign Application Priority Data

Apr. 29, 2016 (CN) .......................... 2016 1 0280078

(51) Int. Cl.
*H01L 31/0236* (2006.01)
*H01L 31/18* (2006.01)
(Continued)

(52) U.S. Cl.
CPC ........ *H01L 31/02363* (2013.01); *C30B 29/06* (2013.01); *C30B 33/10* (2013.01);
(Continued)

(58) Field of Classification Search
CPC ......... H01L 31/02363; H01L 21/30604; H01L 33/10; H01L 31/18; H01L 31/0236;
(Continued)

(56) References Cited

U.S. PATENT DOCUMENTS 8,865,509 B2 * 10/2014 Nishimoto ........ H01L 31/02363
257/E31.13
2012/0295447 A1 * 11/2012 Tamboli ............ H01L 31/02363
438/753
(Continued)

FOREIGN PATENT DOCUMENTS

CN 102888656 A 1/2013
CN 103219428 A 7/2013
(Continued)

*Primary Examiner* — Lan Vinh
(74) *Attorney, Agent, or Firm* — CBM Patent Consulting, LLC

(57) ABSTRACT

It discloses a texturing method for a diamond wire cut polycrystalline silicon slice, including the following steps: firstly, immersing the diamond wire cut polycrystalline silicon slice into a mixed aqueous solution of an alkali solution and an alkali reaction control agent, removing a damaged layer on a surface of the silicon slice, and then immersing the silicon slice into a hydrofluoric acid solution containing inorganic ions and organic molecules for reaction; secondly, pretreating the polycrystalline silicon surface by a mixed solution of hydrofluoric acid and hydrogen peroxide, adding a pore-forming regulator at the same time, and finally texturing the surface of the silicon slice by a mixed acid solution of hydrofluoric acid and nitric acid.

8 Claims, 11 Drawing Sheets

(51) Int. Cl.
*C30B 33/10* (2006.01)
*C30B 29/06* (2006.01)
*H01L 21/306* (2006.01)
*H01L 33/10* (2010.01)

(52) U.S. Cl.
CPC .... *H01L 21/30604* (2013.01); *H01L 31/0236* (2013.01); *H01L 31/18* (2013.01); *H01L 31/182* (2013.01); *H01L 33/10* (2013.01); *Y02E 10/50* (2013.01); *Y02P 70/521* (2015.11)

(58) Field of Classification Search
CPC ....... H01L 31/182; C30B 33/10; C30B 29/06; Y02E 10/50; Y02P 70/521; H04R 1/323; H04R 2400/11; H04R 2499/11; H04R 7/04; H04R 7/127; H04R 7/20; H04R 9/06
USPC .... 216/99, 102, 103, 107, 108; 134/1.1, 1.2, 134/1.3, 3; 438/745, 753, 756
See application file for complete search history.

(56) References Cited

U.S. PATENT DOCUMENTS

| | | | |
|---|---|---|---|
| 2013/0025663 A1 | 1/2013 | Liu et al. | |
| 2013/0130508 A1* | 5/2013 | Wu | H01L 21/30604 438/753 |
| 2014/0057383 A1* | 2/2014 | Okuuchi | H01L 31/02363 438/71 |
| 2015/0050556 A1* | 2/2015 | Liu | C09K 13/08 429/218.1 |

FOREIGN PATENT DOCUMENTS

| | | |
|---|---|---|
| EP | 2615634 A1 | 7/2013 |
| KR | 10-2012-0102908 A | 9/2012 |

* cited by examiner

TEXTURING METHOD FOR DIAMOND WIRE CUT POLYCRYSTALLINE SILICON SLICE

TECHNICAL FIELD

The present invention belongs to the field of polycrystalline silicon solar cell manufacturing, and particularly relates to a texturing method for a diamond wire cut polycrystalline silicon slice.

BACKGROUND ART

At present, a mortar multi-wire cutting technology is mainly used to cut crystalline silicon slices used in the photovoltaic industry. However, this technology has many problems such as low cutting efficiency, high cost and waste mortar emission pollution after cutting. In contrast, a method for slicing polycrystalline silicon ingots by diamond wires has attracted much attention because of the advantages of low processing cost, high cutting efficiency and environment friendliness. However, compared with a mortar cut silicon slice, a diamond wire cut polycrystalline silicon slice has a thinner surface of damaged layer, and reactivity is insufficient. A traditional acid texturing process used to cut polycrystalline silicon slices with mortar cannot achieve texturing of diamond wire cut polycrystalline silicon slices. People in the crystalline silicon battery industry have been eager to solve this problem.

The invention entitled "Texturing method for diamond wire cut polycrystalline silicon slice" with the application number 201410430817.2 discloses that texturing is carried out by using an alkaline mixed solution containing sodium hydroxide, absolute ethanol or isopropanol, and a textured surface prepared by the method has a good light trapping effect and can make the surface reflectivity of the silicon slice lower. However, due to the fact that the surface of the polycrystalline silicon slice has various crystal planes such as [100], [110] and [111] which have different reactivities, a uniform textured surface with small color difference and high light conversion efficiency is hard to form with the alkaline solution, and a fill factor of a manufactured battery piece is also high; furthermore, according to the method, texturing needs to be carried out at a high temperature (i.e. 50-100° C.), and the texturing component isopropyl alcohol is likely to volatilize toxic gases at a high temperature. Therefore, the method is not energy-efficient or environment-friendly, and is not suitable for popularization and application.

The invention entitled "Texturing method for diamond wire cut silicon slice" with the patent number 201110112185.1 discloses that texturing is carried out by adding an additive $H_2SO_4$ or $H_3PO_4$ which can control a reaction rate to a conventional acid texturing $HF—HNO_3$ system. The invention entitled "Additive for acid texturing of diamond wire cut polycrystalline silicon slice and using method" with the application number 201310049552.7 discloses that a mixed aqueous solution of polyvinyl alcohol and polyethylene glycol as additives is added into a conventional acid texturing $HF—HNO_3$ system. Both of the above patents can effectively reduce the reflectivity of silicon slices after texturing. However, due to insufficient reactivity and an insufficient degree of reflectivity reduction of a surface of diamond wire cut polycrystalline silicon, an efficient "light trapping" structure is hard to form on the surface of silicon slices, and the industry standard of photoelectric conversion cannot be met.

The invention entitled "Preparation method of RIE textured polycrystalline silicon solar cell" with the patent number 201410694985.2 discloses a preparation method of an RIE textured polycrystalline silicon solar cell. The so-called dry etching method is complicated in process. A damaged layer needs to be removed in a solution firstly, then plasma generated by $SF_6$ and $Cl_2$ is used for etching in a high vacuum environment. The method can be used to prepare diamond wire cut textured polycrystalline silicon slices with low reflectivity, photoelectric conversion efficiency is improved, but equipment cost and equipment depreciation cost are high, and cost performance is poor. Besides, due to extra sulfide and halogen compound emissions, especially $Cl_2$, a highly toxic gas, the environmental protection effect is insufficient.

In recent years, people have paid attention to a wet chemical method of etching polycrystalline silicon with assistance of metal ions to prepare a diamond wire cut polycrystalline silicon textured surface. Patent number 200780049395.2 discloses a method of etching a surface of polycrystalline silicon with assistance of metal ions represented by silver ions to prepare a diamond wire cut polycrystalline silicon textured surface. The method includes the following steps: putting a silicon slice in a mixed solution containing metal ions, an oxidant hydrogen peroxide and hydrofluoric acid for reaction to form a porous layer on the surface of the silicon slice, and then further etching the silicon slice with the porous layer in a mixed solution of hydrofluoric acid and nitric acid to form the textured surface with a large opening. The method can effectively reduce the reflectivity of the silicon slice and improve efficiency, but there are also obvious shortcomings: firstly, a uniform textured surface with small color difference and high light conversion efficiency cannot be formed on the surfaces of the polycrystalline silicon slices with various crystal planes such as [100], [110] and [111], i.e., the problem of difficult in achieving appearance uniformness of mass production cannot be solved; secondly, by putting the silicon slice in the mixed solution containing metal ions, the oxidant hydrogen peroxide and hydrofluoric acid for reaction to form the porous layer on the surface of the silicon slice, instability of the solution can be caused easily, the textured surface fluctuates greatly during batch reaction, and the service life of the solution is short. Patent number 201310127230.X discloses a textured structure of a crystalline silicon solar cell and a preparation method thereof. In the method, a layer of metal nanoparticles is coated on a surface, then the surface of a silicon slice is subjected to corrosion treatment, and finally the surface of the silicon slice is modified and etched. By means of the method, a textured polycrystalline silicon slice with low reflectivity can be obtained effectively, but the textured structure is limited to 100-500 nm, and the obtained textured slice also has the problems of textured surface nonuniformity and large color difference.

Therefore, there is an urgent need to research and develop a preparation method of a textured polycrystalline silicon slice which can improve the uniformity of a textured surface of a diamond wire cut polycrystalline silicon slice, increase surface reflectivity and realize high battery piece efficiency and is suitable for popularization and application.

SUMMARY OF THE INVENTION

Object of the invention: the invention is developed in view of the above, and aims to provide a texturing method for a diamond wire cut polycrystalline silicon slice with a uniform textured surface, an aperture of 200 nm-2 μm, a hole depth of 300-500 nm, low surface reflectivity and high photoelectric conversion efficiency.

Technical scheme: in order to realize the above object, the invention provides a texturing method for a diamond wire cut polycrystalline silicon slice, including the following steps:

(1) a first procedure: immersing the diamond wire cut polycrystalline silicon slice into a mixed aqueous solution of an alkali solution and an alkali reaction control agent, removing a damaged layer on a surface of polycrystalline silicon to form a silicon slice convex structure, and then immersing the silicon slice into mixed acid for cleaning, wherein the alkali reaction control agent is beneficial to decontamination and defoaming of the surface of the silicon slice and the formation of the convex microstructure during reaction, and is more beneficial to subsequent processing; and furthermore, the concentration of the alkali reaction control agent is 0.1-1%, and the alkali reaction control agent can include one or more of polycarboxylic acid, isooctyl polyoxyethylene ether phosphate, allyl alcohol polyoxyalkyl ether, polyethylene glycol monomethyl ether, polyethylene glycol, hexadecyl trimethyl ammonium chloride or a perfluorooctyl amphoteric phosphate fluorocarbon surfactant;

(2) a second procedure: cleaning the polycrystalline silicon slice subjected to the first procedure in mixed acid, and then immersing the polycrystalline silicon slice into a hydrofluoric acid solution containing inorganic ions and organic molecules to react for 5-300 s to deposit metal particles on the surface of the silicon slice, wherein the concentration of the inorganic ions is $1\times10^{-6}$-$5\times10^{-2}$ mol/L, the inorganic ions include inorganic cations and inorganic anions, the inorganic cations are one or more of copper ions, silver ions or silver ammonium ions, and the inorganic anions are chloroauric acid ions and/or nitrate ions; preferably, when the inorganic cations are silver ions and the concentration is 5E-4 mol/L, the obtained polycrystalline silicon slice has a more uniform textured surface after texturing, and has lower reflectivity and higher conversion efficiency; and the concentration of the organic molecules is $1\times10^{-4}$-$5\times10^{-2}$ mol/L, the organic molecules are one or more of methanol, ethanol, polyethylene glycol, formic acid, acetaldehyde, vitamin C, citric acid, glucose, methylamine or ethylenediamine, and the addition of the organic molecules is helpful to the deposition stability and auxiliary reduction of metal ions, making the deposition of the metal particles on the surface of the silicon slice more uniform and the batch more stable; and further, the silicon slice with the metal particles deposited on the surface can be immersed in the hydrofluoric acid solution containing the inorganic ions and the organic molecules brought in by a reaction tank in step (2) to further enable the inorganic metal ions to assist in depositing the metal particles on the surface of the silicon slice, wherein the concentration of hydrofluoric acid is 0.1-1 mol/L and reaction time is 30 s-120 s;

(3) a third procedure: forming pores in the silicon slice with the metal particles deposited on the surface in a mixed solution containing a pore-forming regulator, hydrofluoric acid and hydrogen peroxide in step (3), so as to form a porous layer on the surface of the silicon slice, wherein when pore forming is carried out on the silicon slice, the concentration of hydrofluoric acid adopted is 1.0-4.0 mol/L, the concentration of hydrogen peroxide is 1.0-5.0 mol/L, reaction time is 1-5 min, and reaction temperature is 10-50° C.; the pore-forming regulator is helpful to regulating a reaction rate of the solution and control the uniformity of the reaction on the surface of polycrystalline silicon, thus preparing a pre-treated slice with low reflectivity and a uniform silicon slice surface, and the concentration of the pre-treated slice may preferably be 0.1-1%; and the pore-forming regulator may include one or more of glucuronic acid, galacturonic acid, fatty acid amide, fatty alcohol polyoxyethylene ether, sodium alginate, sodium cellulose, glucosamine, sodium carboxylate, octadecatrienoic acid or oleic acid;

(4) a fourth procedure: after cleaning the polycrystalline silicon slice subjected to the above-mentioned procedure by deionized water and a nitric acid solution, texturing the surface of the silicon slice by a mixed acid solution of hydrofluoric acid and nitric acid, wherein during texturing, the concentration of hydrofluoric acid adopted may be 1.5-5.0 mol/L, the concentration of nitric acid may be 4.0-7.0 mol/L, and a reaction condition is that reaction goes on for 30-120 s at 8-50° C.

Further, the above-mentioned textured silicon slice can be later cleaned in a sequence of alkali washing, ammonia water/hydrogen peroxide mixed solution washing, hydrofluoric acid washing and water washing, thus obtaining the textured polycrystalline silicon slice. Further, alkaline washing is to correct and etch the polycrystalline silicon slice to remove remaining micro particles on the surface of the polycrystalline silicon, and ammonia water/hydrogen peroxide mixed solution washing is to further remove the metal particles on the surface of the polycrystalline silicon on the basis of the previous nitric acid solution washing, so as to ensure that the metal particles on the surface of the polycrystalline silicon are removed completely.

Beneficial effect: compared with the prior art, the present invention has the remarkable advantages that:

firstly, the damaged layer generated during silicon slice cutting is removed through the initial alkali reaction, and the convex microstructure is generated on the surface of the silicon slice, which is favorable for subsequent processing to form a better "light trapping" structure; secondly, the deposition of the metal particles is separated from the process of forming pores in the surface of the silicon slice, thus being beneficial to the uniform deposition of the metal particles on the surface of the silicon slice, and the deposition quantity can be controlled conveniently; and thirdly, the pore-forming regulator is added to the mixed solution of hydrofluoric acid and hydrogen peroxide, so that porous layers can be formed on different crystal faces of the surface of the polycrystalline silicon slice and a uniform textured surface with small color difference can be formed in the subsequent process. In addition to the above advantages, the present invention also has the following advantages that: firstly, during the preparation of the textured polycrystalline silicon slice, deweighting of the silicon slice mainly occurs in the alkali treatment process (step S1), little weight is removed in the pore-forming and texturing procedure, and fewer nitrogen oxides are generated, so that the emission of nitrogen oxides is reduced, production efficiency is improved and production cost is reduced; secondly, the surface of the silicon slice is treated by a low-concentration metal ion etchant and low-concentration mixed acid to control the reaction rate of the silicon slice, so that the metal ions can be easily removed and purified; thirdly, the metal particles are removed in two procedures (S6 and S9), and the two cleaning procedures ensure that the metal particles are completely removed without forming too many composite centers on the surface of the silicon slice; fourthly, the textured polycrystalline silicon slice prepared by the method not only has a uniform textured surface with small color difference and consistent etching depth, but also has low surface reflectivity and obviously improves the conversion efficiency of the silicon slice; in addition, the preparation method is simple and feasible, the reagent cost is low, the reaction conditions are easy to realize, the compatibility with the existing industrial production process is good, and the preparation method is suitable for popularization and application.

DETAILED DESCRIPTION OF THE INVENTION

Figure 1:
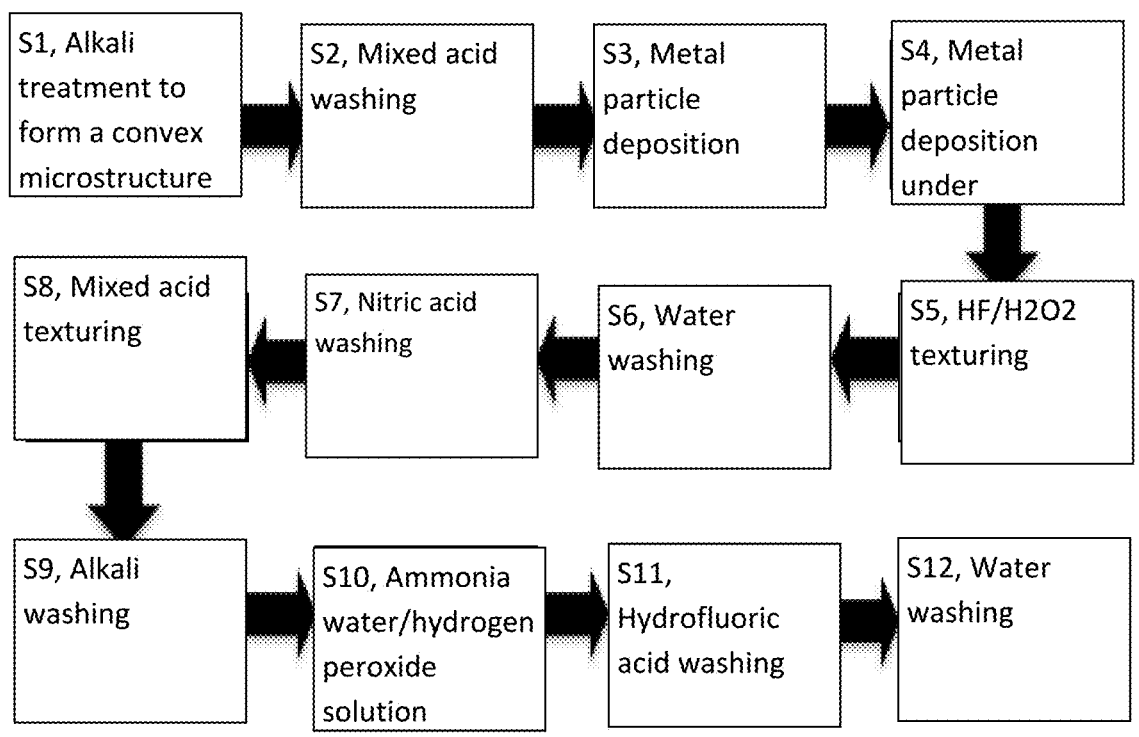
FIG. 1 is a flowchart illustrating a texturing method for a diamond wire cut polycrystalline silicon slice in an embodiment 1 of the present invention.

The technical scheme of the present invention will be further explained below with reference to the attached drawings.

Raw materials adopted in the present invention for texturing of a diamond wire cut polycrystalline silicon slice all can be purchased from the market, wherein the mass fraction of nitric acid used is 65%, the mass fraction of hydrogen peroxide is 30%, and the mass fraction of hydrofluoric acid is 40%.

Embodiment 1

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent with a concentration of 0.3% at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 2% during surface treatment, the alkali reaction control agent is polycarboxylic acid, isooctyl polyoxyethylene ether phosphate and allyl alcohol polyoxyalkyl ether, the treatment temperature is 82° C., and the treatment time is 5 min; and during cleaning, the volume ratio of hydrofluoric acid to the nitric acid solution is 1:1, the treatment temperature is 25° C., and the treatment time is 1 min;

(2) taking out the cleaned silicon slice and immersing the silicon slice into a hydrofluoric acid solution containing inorganic ions and organic molecules for reaction, wherein the inorganic cations are copper ions, the inorganic anions are chloroauric acid ions, the concentration of the inorganic ions is $1 \times 10^{-3}$ mol/L, the organic molecules are methanol, formic acid and methylamine, the concentration of the organic molecules is $5 \times 10^{-4}$ mol/L, the concentration of hydrofluoric acid is 1 mol/L, the reaction temperature is 30° C., and the reaction time is 120 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 0.1 mol/L, and the reaction time is 30 s;

(4) taking out the silicon slice, and immersing the silicon slice into a mixed solution of hydrofluoric acid, hydrogen peroxide and a pore-forming regulator to carry out pretreatment on the surface of the silicon slice, wherein the concentration of hydrofluoric acid is 1 mol/L, the concentration of hydrogen peroxide is 5.0 mol/L, the concentration of the pore-forming regulator is 0.5%, the pore-forming regulator is glucuronic acid and fatty acid amide, the pretreatment time is 300 s, and the temperature is 35° C.;

(5) cleaning the pretreated silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution adopted in cleaning is 1:1, the cleaning temperature of the mixed acid solution is 25° C., and the time is 1 min; and during texturing, the concentration of nitric acid adopted is 7.0 mol/L, the concentration of hydrofluoric acid is 5.0 mol/L, the texturing time is 120 s, and the texturing temperature is 8° C.;

(6) taking out the textured silicon slice and immersing the silicon slice into a sodium hydroxide solution for initial cleaning, wherein the concentration of the sodium hydroxide solution is 1%, cleaning is carried out for 30 s, and the cleaning temperature is 25° C.;

(7) immersing the silicon slice into a mixed aqueous solution of ammonia water and hydrogen peroxide, wherein the concentration of ammonia water is 0.5 mol/L, the concentration of hydrogen peroxide is 0.5 mol/L, cleaning is carried out for 2 min, and the cleaning temperature is 25° C.; and (8) finally cleaning and drying the silicon slice in step (6) with a hydrofluoric acid solution and DI water to obtain a textured polycrystalline silicon slice, wherein the concentration of the hydrofluoric acid solution is 1 mol/L, the cleaning time is 30 s, and the cleaning temperature is 50° C.; and the DI water cleaning time is 60 s, the cleaning temperature is 50° C., the drying time is 220 s, and the drying temperature is 90° C.

Comparative Example 1

A P-type 156 polycrystalline silicon slice cut by a diamond wire, the same as that in the embodiment 1 is used as a matrix material for conventional acid texturing. The conventional acid texturing means that a polycrystalline silicon slice cut by a diamond wire is directly subjected to mixed acid texturing after being treated with alkali.

Embodiment 2

The basic steps are the same as those of the embodiment 1, except that the inorganic cations in step (2) are silver ions.

The silicon slices prepared in the embodiment 1, the comparative example 1 and the embodiment 2 are sampled to measure the reflectivity of the silicon slices, and the silicon slices are sampled and treated as follows:

(1) putting the silicon slice into a tubular diffusion furnace for diffusion treatment;

(2) carrying out edge etching and dephosphorization silicon glass treatment on the diffused silicon slice;

(3) depositing a silicon nitride antireflection film 83 nm on a front surface treated in step (2) by a tubular PECVD method;

(4) printing a back electrode and an aluminum back field on a back surface, and printing a grid line on the front surface of the silicon slice; and (5) sintering to test the electrical properties of a battery piece.

The silicon slices prepared in the embodiment 1, the comparative example 1 and the embodiment 2 are tested for reflectivity and electrical properties. Results obtained are shown in Table 1 and Table 2.

TABLE 1

Reflectivity table of silicon slices prepared in embodiment 1, embodiment 2 and comparative example 1

| Embodiment | Properties Average reflectivity (%) (300-1100 nm) |
|---|---|
| Embodiment 1 | 19.51 |
| Comparative example 1 | 25.34 |
| Embodiment 2 | 16.31 |

TABLE 2

Electrical properties table of silicon slices prepared in embodiment 1, embodiment 2 and comparative example 1

| Embodiment | Properties | | | | | |
|---|---|---|---|---|---|---|
| | Open-circuit voltage (V) | Short-circuit current (A) | Series resistance ($\Omega$) | Parallel resistance ($\Omega$) | Fill factor (%) | Conversion efficiency (%) |
| Embodiment 1 | 0.6401 | 8.866 | 608 | 1.83 | 79.88 | 18.63 |
| Comparative example 1 | 0.6291 | 8.799 | 216 | 0.01 | 79.78 | 18.13 |
| Embodiment 2 | 0.6392 | 8.925 | 350.2 | 1.62 | 80 | 18.76 |

Figure 2:
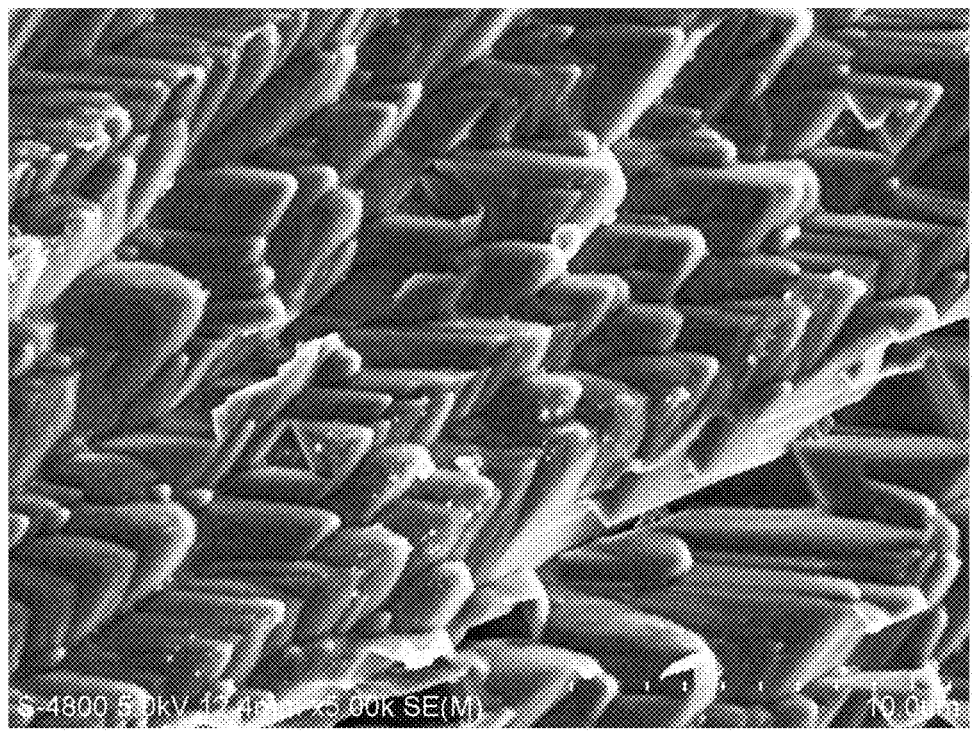
FIG. 2 is a scanning electron microscope (SEM) diagram of a polycrystalline silicon slice treated with an alkali solution containing an alkali reaction control agent in the texturing method for the diamond wire cut polycrystalline silicon slice in the embodiment 1 of the present invention.
Figure 3:
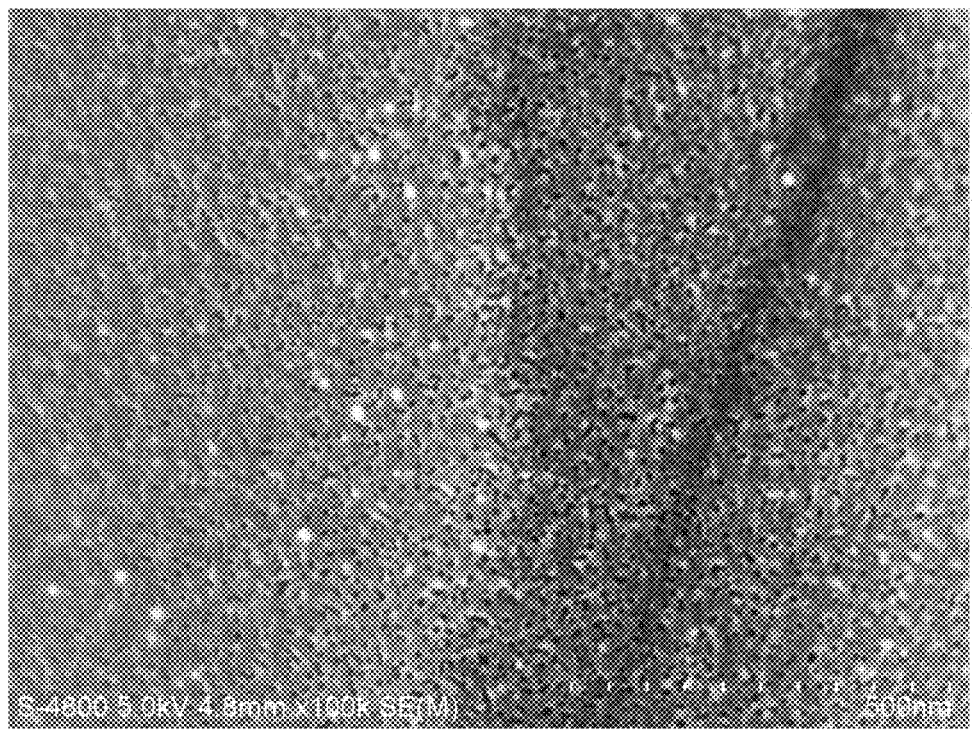
FIG. 3 is a scanning electron microscope (SEM) diagram of a polycrystalline silicon slice with deposited metallic silver particles (step S3) in a texturing method for a diamond wire cut polycrystalline silicon slice in an embodiment 2 of the present invention.
Figure 4:
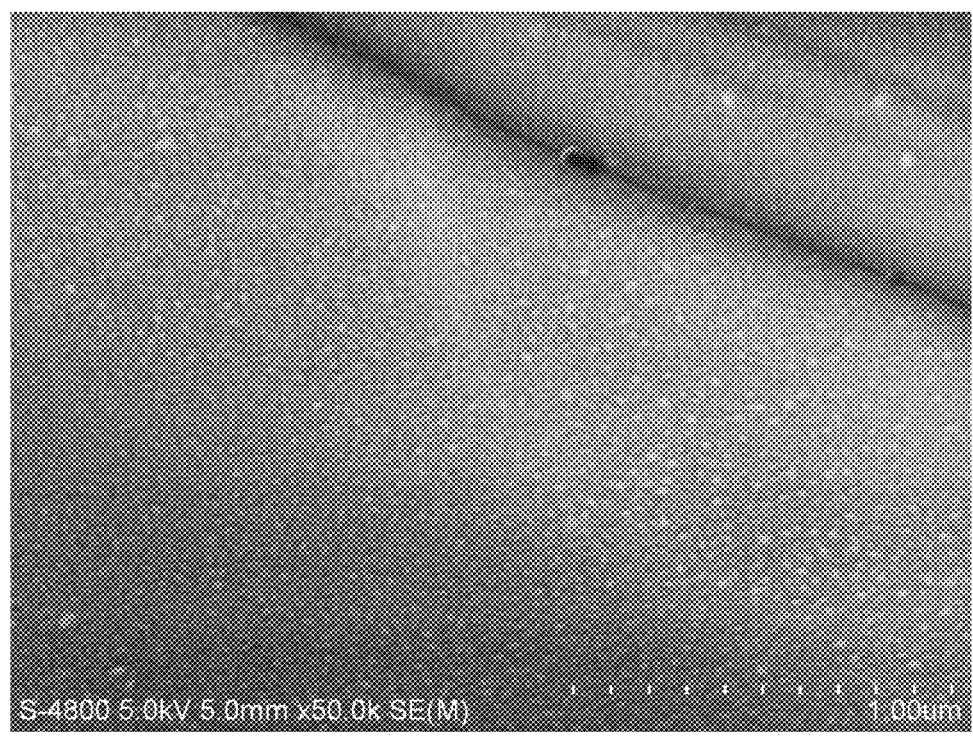
FIG. 4 is a scanning electron microscope (SEM) diagram of a polycrystalline silicon slice with deposited metallic silver particles under assistance (step S4) in the texturing method for the diamond wire cut polycrystalline silicon slice in the embodiment 2 of the present invention.
Figure 5:
FIG. 5 is a macro photograph taken after treatment with a mixed solution of hydrofluoric acid and hydrogen peroxide containing a pore-forming additive in the texturing method for the diamond wire cut polycrystalline silicon slice in the embodiment 2 of the present invention.
Figure 6:
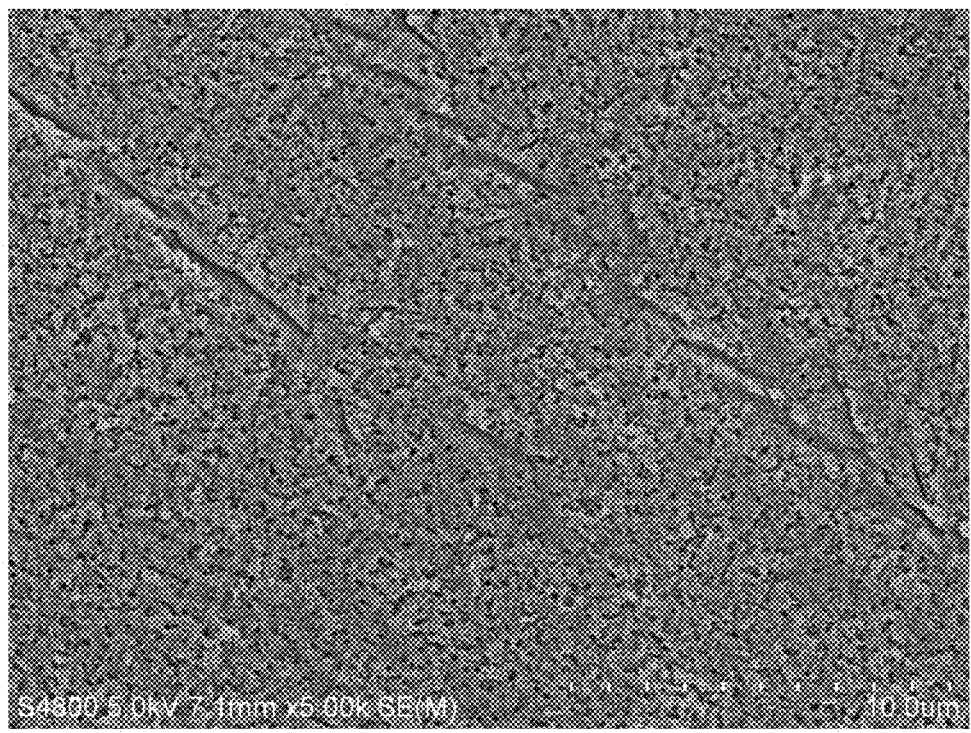
FIG. 6 is a scanning electron microscope (SEM) diagram taken after treatment with a mixed solution of hydrofluoric acid and hydrogen peroxide containing a pore-forming additive in the texturing method for the diamond wire cut polycrystalline silicon slice in the embodiment 2 of the present invention.
Figure 7:
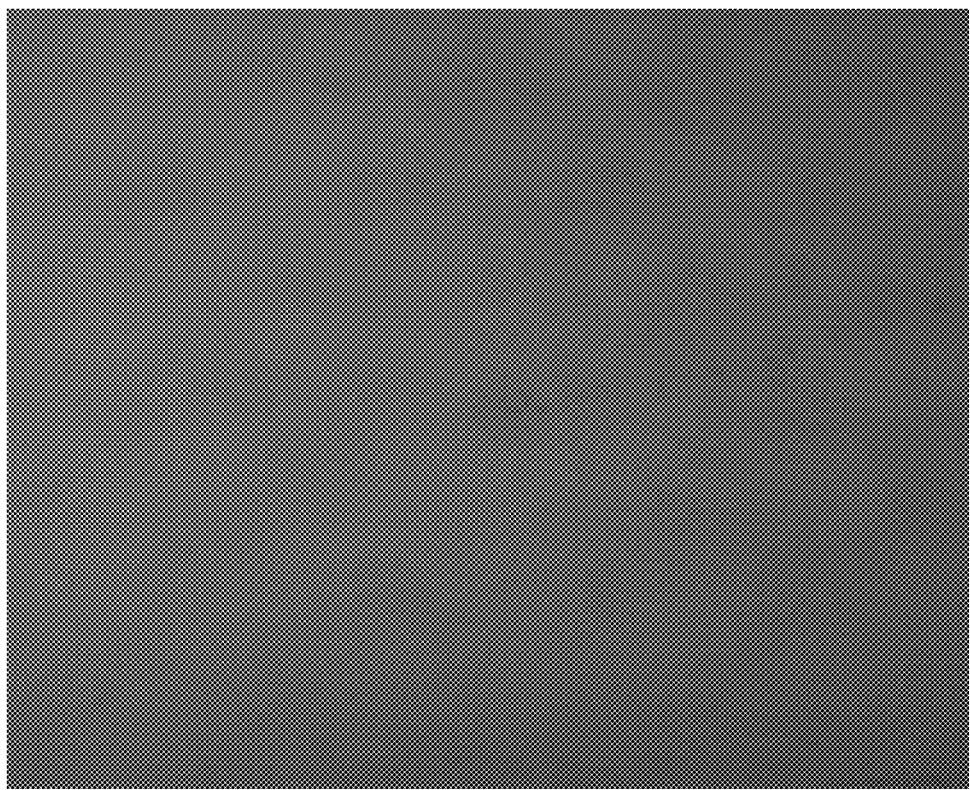
FIG. 7 is a macro photograph taken after texturing of the diamond wire cut polycrystalline silicon slice in the embodiment 2 of the present invention.
Figure 8:
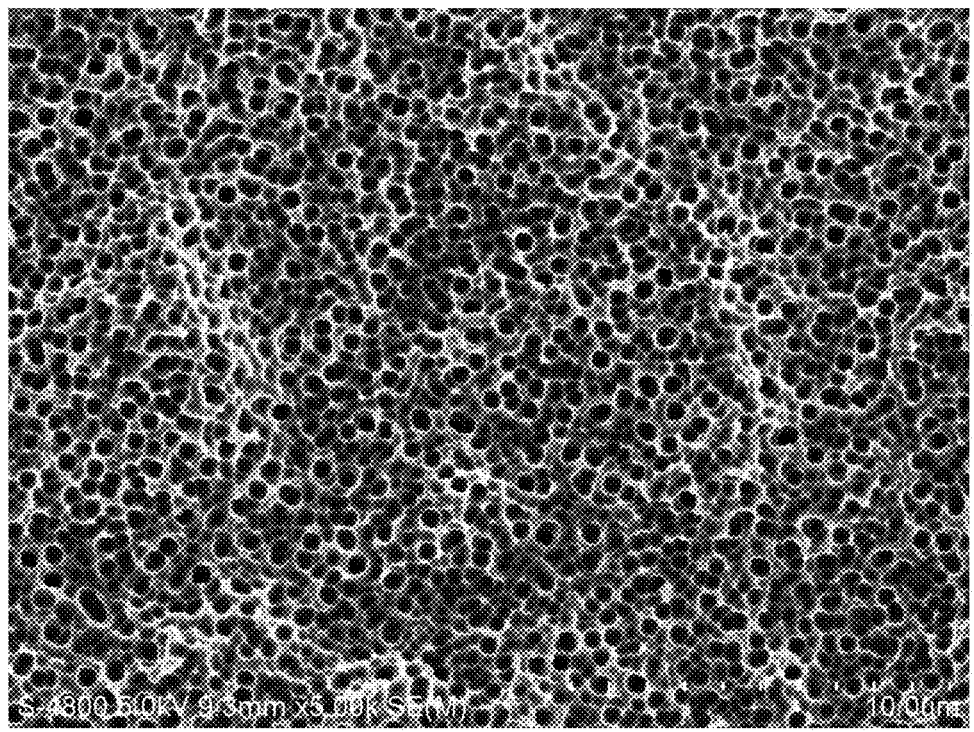
FIG. 8 is a surface scanning electron microscope (SEM) diagram taken after texturing of the diamond wire cut polycrystalline silicon slice in the embodiment 2 of the present invention.
Figure 9:
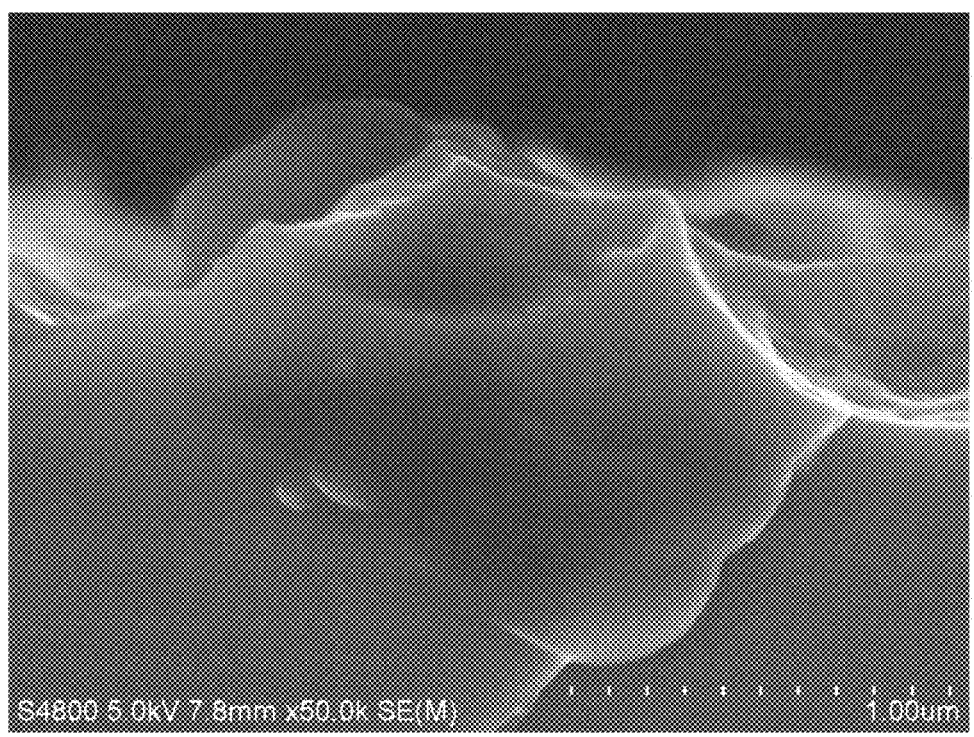
FIG. 9 is a section scanning electron microscope (SEM) diagram taken after texturing of the diamond wire cut polycrystalline silicon slice in the embodiment 2 of the present invention.
Figure 13:
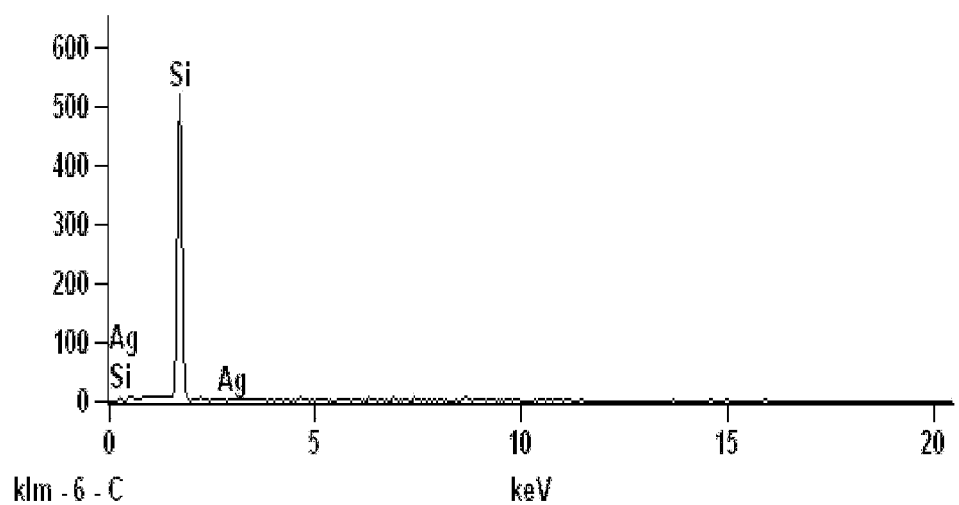
FIG. 13 is a data diagram obtained by analyzing textured surface elements after texturing of the diamond wire cut polycrystalline silicon slice in the embodiment 2 of the present invention.

Texturing in the embodiment 1 and the embodiment 2 of the present invention is carried out according to the process flow of FIG. 1, that is to carry out alkali treatment first to obtain the convex microstructure on the surface of the silicon slice. FIG. 2 is a scanning electron microscope diagram taken after treatment with the alkali solution containing the added alkali reaction control agent (step S1). The metal particles are then deposited on the diamond wire cut polycrystalline silicon slice (step S3). FIG. 3 is a scanning electron microscope diagram of measurement results obtained after depositing the metal particles. As shown in FIG. 3, white metal particles are attached to the surface of the diamond wire cut polycrystalline silicon. FIG. 4 is a scanning electron microscope diagram of depositing the metal particles under assistance (step S4). It can be seen from the diagram that the distribution of the metal particles deposited on the surface of FIG. 4 is more uniform than that of FIG. 3. The process of depositing the metal particles under assistance (step S4) can make full use of the inorganic ions and the organic molecules brought in by the reaction tank to improve the uniformity of metal ions deposited on the surface of the polycrystalline silicon, and prevent the metal ions and the organic molecules from being brought into the pore-forming solution along with the reaction tank, which is beneficial to the stability of the pore-forming reaction solution. Thereafter, the polycrystalline silicon slice with the deposited metal particles is immersed in the mixed aqueous solution of hydrofluoric acid and hydrogen peroxide containing the pore-forming additive to carry out a pore-forming reaction (step S5). As shown in FIG. 5 and FIG. 6, a porous structure on the surface of the polycrystalline silicon is formed by the pore-forming reaction. Then the polycrystalline silicon slice is cleaned with the nitric acid solution (step S6) to remove the metal particles deposited on the surface of the polycrystalline silicon, then texturing is carried out on the polycrystalline silicon of the porous structure with the mixed aqueous solution of hydrofluoric acid and nitric acid (step S7) to remove the porous structure with an uneven surface, so as to obtain a uniform honeycomb structure with small color difference, and the appearance of a textured surface is as shown in FIG. 7. FIG. 8 is a scanning electron microscope diagram of a polycrystalline silicon textured surface with a uniform honeycomb structure. The honeycomb pore diameter of the textured surface is 200-300 nm. FIG. 9 is a scanning electron microscope diagram of the cross section of the polycrystalline silicon textured surface. The honeycomb pore depth of the textured surface is about 300 nm. Finally, the silicon slice is cleaned with the alkali solution and the mixed aqueous solution of ammonia water and hydrogen peroxide, the former is to remove the residual microparticles on the porous structure of the silicon slice, and the latter is to ensure that the metal particles are completely removed. As shown in FIG. 13, there is no silver particle residue on the surface of the silicon slice, which shows that the two procedures (steps S6 and S9) have a good effect in removing the metal particles.

In addition, the prominent alkali reaction process in the texturing method for the diamond wire cut polycrystalline silicon slice in the embodiment 1 and the embodiment 2 of the present invention removes the damaged layer on the surface of the silicon slice, and the convex microstructure is obtained, so that 0.3-0.4 g of weight is removed from the silicon slice, which greatly weakens the subsequent weight removal requirements. Therefore, pore-forming (step S5) and texturing (step S8) of the diamond wire cut polycrystalline silicon slice can be carried out under the conditions of low temperature and solution concentration to obtain the textured polycrystalline silicon slice, greatly optimizing the realizing conditions and saving the production cost.

Figure 10:
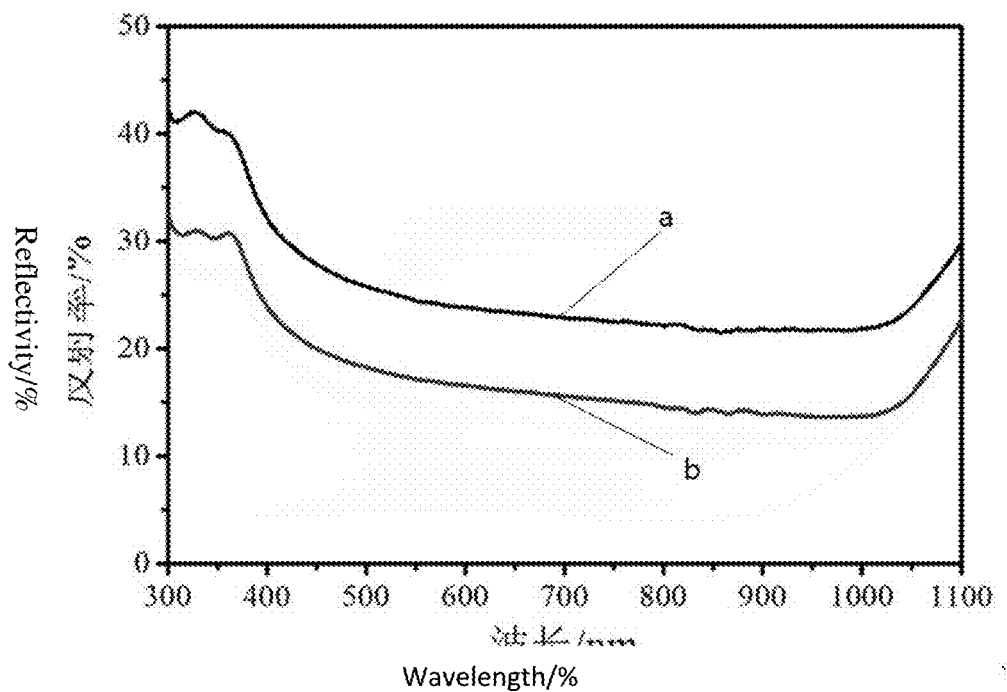
FIG. 10 is a comparative diagram of the reflectivity of the diamond wire cut polycrystalline silicon slice in embodiment 1 of the present invention and the reflectivity of a diamond wire cut polycrystalline silicon slice in a comparative example 1 after texturing, wherein (a) is a reflectivity curve of comparative example 1, and (b) is a reflectivity curve of embodiment 1.
Figure 11:
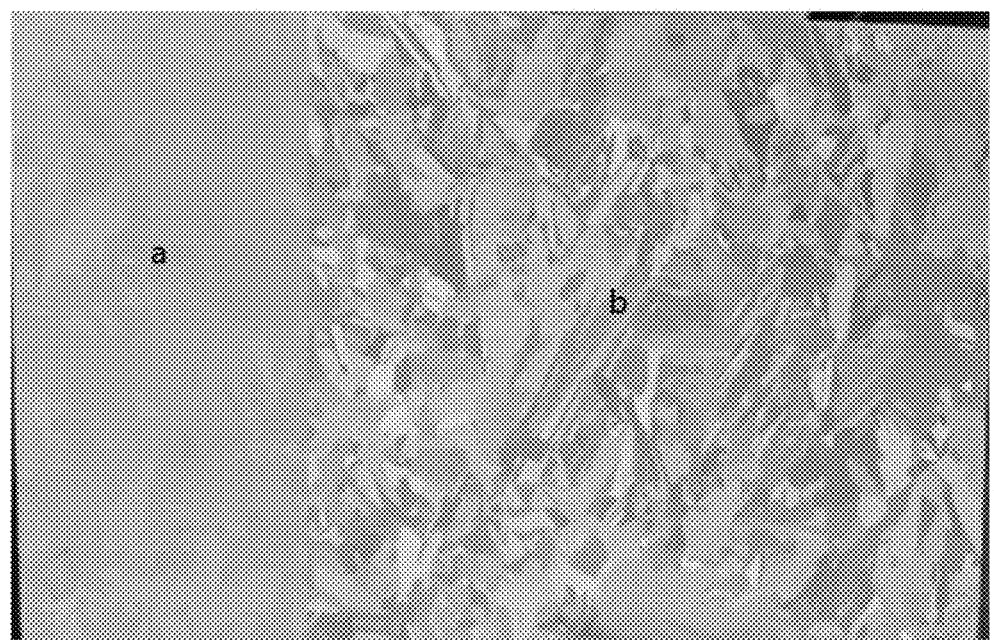
FIG. 11 is a macroscopic comparison diagram taken after texturing of the diamond wire cut polycrystalline silicon slice in embodiment 1 of the present invention and the diamond wire cut polycrystalline silicon slice in comparative example 1, wherein (a) is a textured surface diagram of embodiment 1, and (b) is a textured surface diagram of comparative example 1.

The invention aims to prepare a textured polycrystalline silicon slice with low reflectivity and high conversion efficiency. As shown in FIG. 10, Table 1 and Table 2, the reflectivity of the diamond wire cut polycrystalline silicon slices prepared by the embodiment 1 and the embodiment 2 of the invention is lower than that of conventional acid texturing in the comparative example 1, and the conversion efficiency of the battery piece made of the diamond wire cut polycrystalline silicon slice is higher than that of conventional acid texturing in the comparative example 1. FIG. 11 shows the appearances of the textured surfaces of the diamond wire cut polycrystalline silicon slices prepared in the embodiment 1 and the comparative example 1. The color difference and uniformity of a textured polycrystalline silicon slice prepared by conventional acid texturing are obviously lower than those of the textured slice prepared in the embodiment 1.

Figure 12:
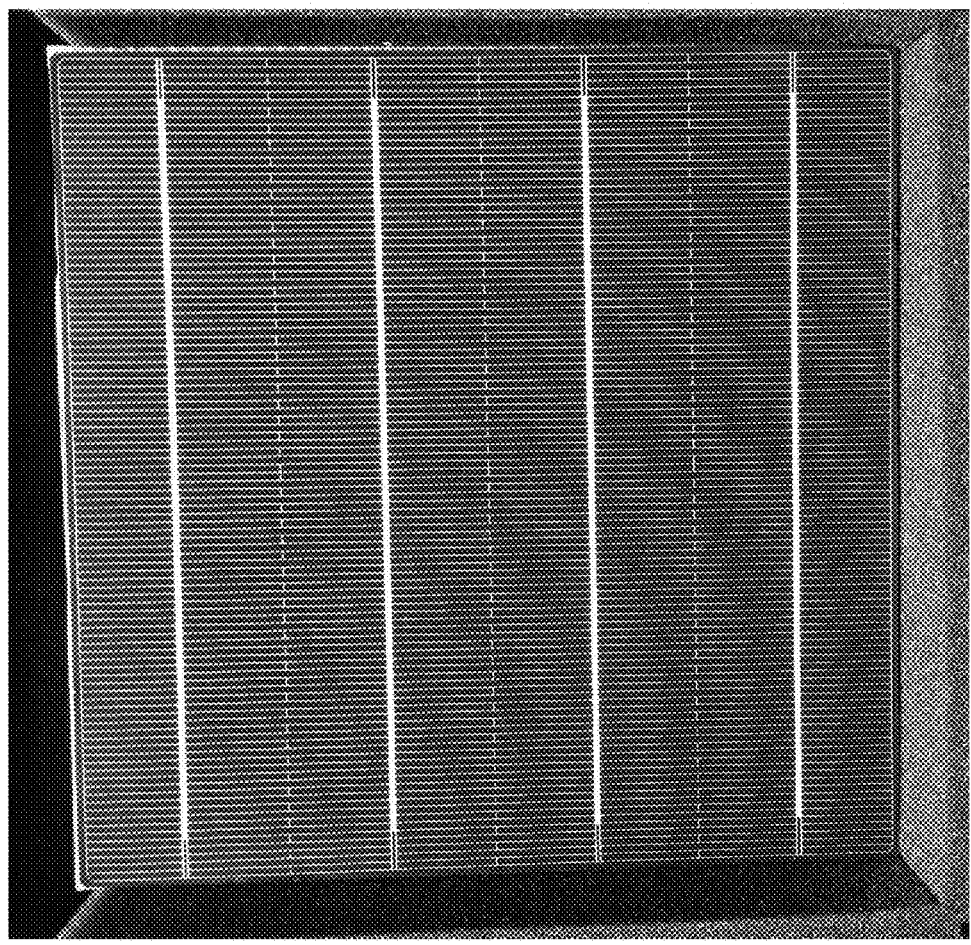
FIG. 12 is a macro photograph taken of a battery piece made of the diamond wire cut polycrystalline silicon slice in the embodiment 2 of the present invention.

In addition, a battery piece shown in FIG. 12 is an appearance diagram of the battery piece made of the polycrystalline silicon slice in the embodiment 2. The overall appearance is uniform and the effect after coating is good. As can be seen from Table 2, the conversion efficiency of the battery piece made in the embodiment 2 is 0.13% higher than that of the battery piece made in the embodiment 1. It can be seen that when the inorganic cations are silver ions, it is more beneficial to the texturing procedure of the diamond wire cut polycrystalline silicon slice.

Embodiment 3

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent with a concentration of 0.1% at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 3% during surface treatment, the alkali reaction control agent is polycarboxylic acid and polyethylene glycol, the treatment temperature is 80° C., and the treatment time is 5 min; and during cleaning, the volume ratio of hydrofluoric acid to the nitric acid solution is 2:1, the treatment temperature is 50° C., and the treatment time is 3 min;

(2) taking out the cleaned silicon slice and immersing the silicon slice into a hydrofluoric acid solution containing inorganic ions and organic molecules for reaction, wherein the inorganic cations are silver ions, the inorganic anions are nitrate ions, the concentration of the inorganic ions is $5 \times 10^{-4}$ mol/L, the organic molecules are ethanol, acetaldehyde and ethylenediamine, the concentration of the organic molecules is $5 \times 10^{-3}$ mol/L, the concentration of hydrofluoric acid is 3 mol/L, the reaction temperature is 35° C., and the reaction time is 100 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 0.5 mol/L, and the reaction time is 60 s;

(4) taking out the silicon slice after reaction, and immersing the silicon slice into a mixed solution of hydrofluoric acid, hydrogen peroxide and a pore-forming regulator to carry out pretreatment on the surface of the silicon slice, wherein the concentration of hydrofluoric acid is 4 mol/L, the concentration of hydrogen peroxide is 3 mol/L, the concentration of the pore-forming regulator is 0.6%, the pore-forming regulator is galacturonic acid and fatty alcohol polyoxyethylene ether, the pretreatment time is 250 s, and the temperature is 40° C.;

(5) cleaning the pre-textured silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution adopted in cleaning is 2:1, the cleaning temperature of the mixed acid solution is 40° C., and the time is 3 min; and during texturing, the concentration of nitric acid adopted is 5 mol/L, the concentration of hydrofluoric acid is 3 mol/L, the texturing time is 80 s, and the texturing temperature is 30° C.;

(6) taking out the textured silicon slice and immersing the silicon slice into a potassium hydroxide solution for initial cleaning, wherein the concentration of the potassium hydroxide solution is 5%, cleaning is carried out for 30 s, and the cleaning temperature is 25° C.;

(7) immersing the silicon slice into a mixed aqueous solution of ammonia water and hydrogen peroxide, wherein the concentration of ammonia water is 1.0 mol/L, the concentration of hydrogen peroxide is 1.0 mol/L, cleaning is carried out for 1 min, and the cleaning temperature is 30° C.; and (8) finally cleaning and drying the silicon slice in step (6) with a hydrofluoric acid solution and DI water to obtain a textured polycrystalline silicon slice, wherein the concentration of the hydrofluoric acid solution is 2 mol/L, the cleaning time is 60 s, and the cleaning temperature is 30° C.; and the DI water cleaning time is 80 s, the cleaning temperature is 50° C., the drying time is 150 s, and the drying temperature is 80° C.

Comparative Example 2

The basic steps are the same as those of the embodiment 3, except that in step (1), the alkali reaction control agent is a mixed additive of alkylphenol polyoxyethylene ether and ethanolamine, and the concentration of the alkali reaction control agent is 0.1%. The silicon slices prepared in the embodiment 3 and the comparative example 2 are sampled and treated as follows:

(1) putting the silicon slice into a tubular diffusion furnace for diffusion treatment;

(2) carrying out edge etching and dephosphorization silicon glass treatment on the diffused silicon slice;

(3) depositing a silicon nitride antireflection film 83 nm on a front surface treated in step (2) by a tubular PECVD method;

(4) printing a back electrode and an aluminum back field on a back surface, and printing a grid line on the front surface of the silicon slice; and (5) sintering to test the electrical properties of a battery piece.

The silicon slices prepared in the embodiment 3 and the comparative example 2 are tested for reflectivity and electrical properties. Results obtained are shown in Table 3 and Table 4.

TABLE 3

Reflectivity table of silicon slices prepared in embodiment 3 and comparative example 2

| Embodiment | Properties Average reflectivity (%) (300-1100 nm) |
| --- | --- |
| Embodiment 3 | 18.2 |
| Comparative example 2 | 25.3 |

TABLE 4

Electrical properties of polycrystalline silicon slices prepared in embodiment 3 and comparative example 2

| | Properties | | | | | |
| --- | --- | --- | --- | --- | --- | --- |
| Embodiment | Open-circuit voltage (V) | Short-circuit current (A) | Series resistance ($\Omega$) | Parallel resistance ($\Omega$) | Fill factor (%) | Conversion efficiency (%) |
| Embodiment 3 | 0.6398 | 8.920 | 326 | 1.43 | 79.97 | 18.80 |
| Comparative example 2 | 0.6311 | 8.691 | 285 | 0.02 | 79.64 | 17.94 |

Figure 14:
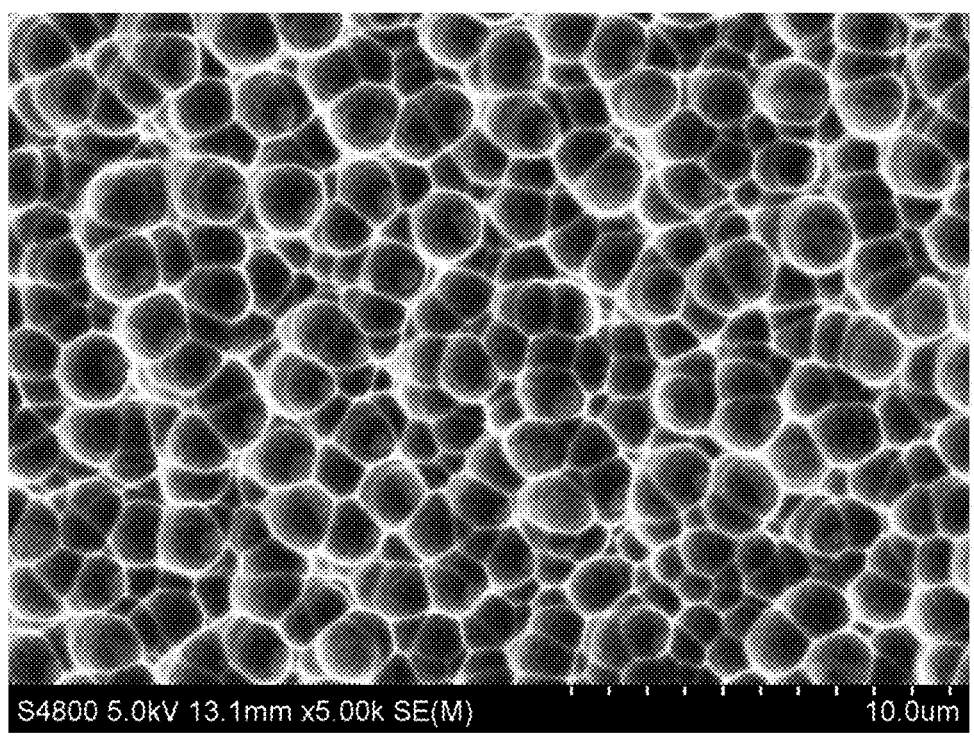
FIG. 14 is a surface scanning electron microscope (SEM) diagram taken after texturing of a diamond wire cut polycrystalline silicon slice in an embodiment 3 of the present invention.

As shown in Table 3, Table 4 and FIG. 14, the honeycomb structure of the textured polycrystalline silicon slice prepared by the present invention is uniform, the pore diameter is about 1 μm, and the reflectivity of the textured slice prepared by the alkali reaction control agent of the present invention is much lower than that of the textured slice prepared by the alkali reaction control agent of the comparative example 2; meanwhile, the photoelectric conversion efficiency is also higher than that of the battery piece prepared in the comparative example 2. This shows that the alkali reaction control agent adopted in the embodiment 3 of the present invention has the effect of obviously improving the performance of polycrystalline silicon.

Embodiment 4

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 8% during surface treatment, the alkali reaction control agent is a perfluorooctyl amphoteric phosphate fluorocarbon surfactant with a concentration of 0.15%, the treatment temperature is 60° C., and the treatment time is 3 min; and during cleaning, the volume ratio of hydrofluoric acid to the nitric acid solution is 3:1, the treatment temperature is 30° C., and the treatment time is 3 min;

(2) taking out the cleaned silicon slice and immersing the silicon slice into a hydrofluoric acid solution containing inorganic ions and organic molecules for reaction, wherein the inorganic cations are silver ions and silver ammonium ions, the inorganic anions are chloroauric acid ions and nitrate ions, the concentration of the inorganic ions is $2.5 \times 10^{-4}$ mol/L, the organic molecules are ethanol, acetaldehyde and ethylenediamine, the concentration of the organic molecules is $1 \times 10^{-2}$ mol/L, the concentration of hydrofluoric acid is 3 mol/L, the reaction temperature is 20° C., and the reaction time is 200 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 0.8 mol/L, and the reaction time is 100 s;

(4) taking out the silicon slice after reaction, and immersing the silicon slice into a mixed solution of hydrofluoric acid, hydrogen peroxide and a pore-forming regulator to carry out pretreatment on the surface of the silicon slice, wherein the concentration of hydrofluoric acid is 4 mol/L, the concentration of hydrogen peroxide is 1.0 mol/L, the concentration of the pore-forming regulator is 1%, the pore-forming regulator is a mixed additive of sodium carboxylate, octadecatrienoic acid and glucosamine, the pretreatment time is 250 s, and the temperature is 50° C.;

(5) cleaning the pretreated silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution used in cleaning is 3:1, the cleaning temperature of the mixed acid solution is 30° C., and the time is 3 min; and during texturing, the concentration of nitric acid used is 5.0 mol/L, the concentration of hydrofluoric acid is 2 mol/L, the texturing time is 30 s, and the texturing temperature is 40° C.;

(6) taking out the textured silicon slice and immersing the silicon slice into a potassium hydroxide solution for initial cleaning, wherein the concentration of the potassium hydroxide solution is 5%, cleaning is carried out for 30 s, and the cleaning temperature is 25° C.;

(7) immersing the silicon slice into a mixed aqueous solution of ammonia water and hydrogen peroxide, wherein the concentration of ammonia water is 1.5 mol/L, the concentration of hydrogen peroxide is 1.5 mol/L, cleaning is carried out for 3 min, and the cleaning temperature is 35° C.; and (8) finally cleaning and drying the silicon slice in step (6) with a hydrofluoric acid solution and DI water to obtain a textured polycrystalline silicon slice, wherein the concentration of the hydrofluoric acid solution is 2 mol/L, the cleaning time is 80 s, and the cleaning temperature is 25° C.; and the DI water cleaning time is 80 s, the cleaning temperature is 60° C., the drying time is 120 s, and the drying temperature is 70° C.

Comparative Example 3

The basic steps are the same as those of the embodiment 4, except that in step (4), the pore-forming regulator is a mixed additive of sodium citrate, polyvinyl alcohol, hydrolyzed polymaleic anhydride and a fluorocarbon surfactant, and the concentration of the pore-forming regulator is 1%.

The silicon slices prepared in the embodiment 4 and the comparative example 3 are sampled and treated as follows:

(1) putting the silicon slice into a tubular diffusion furnace for diffusion treatment;

(2) carrying out edge etching and dephosphorization silicon glass treatment on the diffused silicon slice;

(3) depositing a silicon nitride antireflection film 83 nm on a front surface treated in step (2) by a tubular PECVD method;

(4) printing a back electrode and an aluminum back field on a back surface, and printing a grid line on the front surface of the silicon slice; and (5) sintering to test the electrical properties of a battery piece.

The silicon slices prepared in the embodiment 4 and the comparative example 3 are tested for reflectivity and electrical properties. Results obtained are shown in Table 5 and Table 6.

TABLE 5

Reflectivity table of silicon slices prepared in embodiment 4 and comparative example 3

| Embodiment | Properties Average reflectivity (%) (300-1100 nm) |
|---|---|
| Embodiment 5 | 16.55 |
| Comparative example 3 | 23.28 |

TABLE 6

Electrical properties table of silicon slices prepared in embodiment 4 and comparative example 3

| Embodiment | Properties | | | | | |
|---|---|---|---|---|---|---|
| | Open-circuit voltage (V) | Short-circuit current (A) | Series resistance (Ω) | Parallel resistance (Ω) | Fill factor (%) | Conversion efficiency (%) |
| Embodiment 5 | 0.6413 | 8.875 | 477 | 1.74 | 79.93 | 18.69 |
| Comparative example 3 | 0.6311 | 8.691 | 285 | 0.02 | 79.64 | 17.94 |

Figure 15:
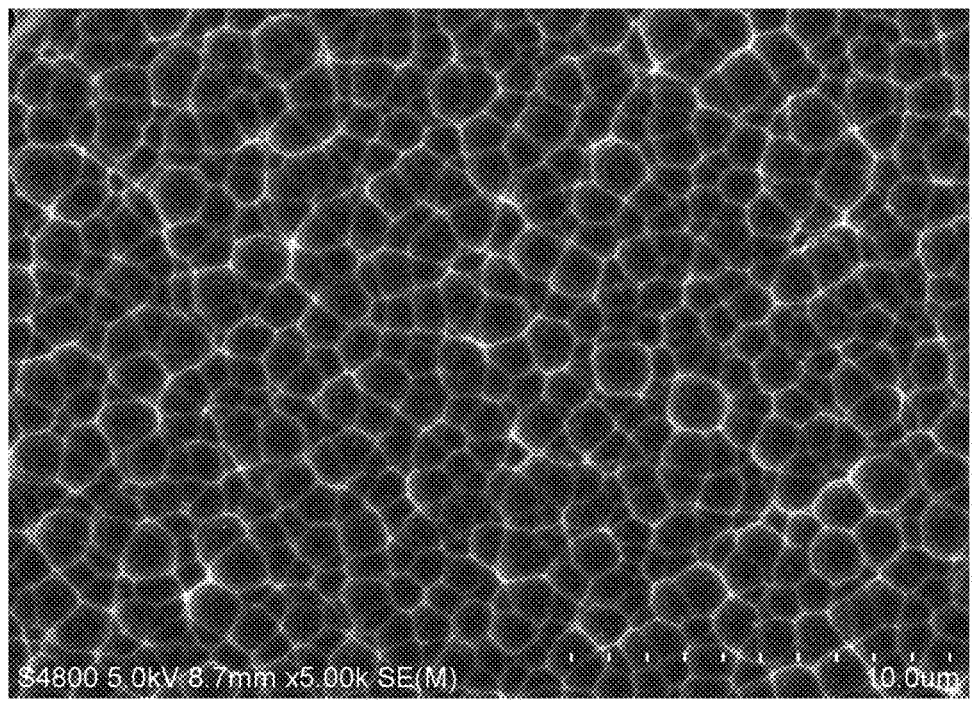
FIG. 15 is a surface scanning electron microscope (SEM) diagram taken after texturing of a diamond wire cut polycrystalline silicon slice in an embodiment 4 of the present invention.

As can be seen from Table 5 and Table 6, the reflectivity and electrical properties of the textured polycrystalline silicon slice prepared by the pore-forming additive used in the embodiment 4 of the present invention are better than the reflectivity and electrical properties of the existing pore-forming additive adopted in the comparative example 3. This is because the pore-forming additive in the present invention not only can eliminate adherent bubbles generated during the reaction on the surface of the silicon slice and stabilize the reaction rate of the solution, but also has the effect of an emulsifier, making the reaction on the surface of the silicon slice tend to be uniform. In addition, as shown in FIG. 15, the textured structure is a macroporous structure with a pore diameter of 1-2 μm, and the textured surface is uniform, which is beneficial to the subsequent coating process.

Embodiment 5

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent with a concentration of 5% at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 8% during surface treatment, the alkali reaction control agent is a mixed additive of polycarboxylic acid and a perfluorooctyl amphoteric phosphate fluorocarbon surfactant, the treatment temperature is 60° C., and the treatment time is 3 min; and during cleaning, the volume ratio of hydrofluoric acid to the nitric acid solution is 3:1, the treatment temperature is 30° C. and the treatment time is 3 min;

(2) taking out the cleaned silicon slice and immersing the silicon slice into a hydrofluoric acid solution containing inorganic ions and organic molecules for reaction, wherein the inorganic cations are copper ions and silver ammonium ions, the inorganic anions are nitrate ions, the concentration of the inorganic ions is $3.5 \times 10^{-4}$ mol/L, the organic molecules are polyethylene glycol and vitamin C, the concentration of the organic molecules is $5 \times 10^{-2}$ mol/L, the concentration of hydrofluoric acid is 1.5 mol/L, the reaction temperature is 15° C., and the reaction time is 100 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 1.0 mol/L, and the reaction time is 120 s;

(4) taking out the silicon slice after reaction, and immersing the silicon slice into a mixed solution of hydrofluoric acid, hydrogen peroxide and a pore-forming regulator to carry out pretreatment on the surface of the silicon slice, wherein the concentration of hydrofluoric acid is 4 mol/L, the concentration of hydrogen peroxide is 5 mol/L, the pore-forming regulator is oleic acid with a concentration of 0.25%, the pretreatment time is 250 s, and the temperature is 50° C.;

(5) cleaning the pretreated silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution used in cleaning is 3:1, the cleaning temperature of the mixed acid solution is 30° C., and the time is 3 min; and during texturing, the concentration of nitric acid used is 4.0 mol/L, the concentration of hydrofluoric acid is 2 mol/L, the texturing time is 80 s, and the texturing temperature is 50° C.;

(6) taking out the textured silicon slice and immersing the silicon slice into a potassium hydroxide solution for initial cleaning, wherein the concentration of the potassium hydroxide solution is 5%, cleaning is carried out for 30 s, and the cleaning temperature is 25° C.;

(7) immersing the silicon slice into a mixed aqueous solution of ammonia water and hydrogen peroxide, wherein the concentration of ammonia water is 1.0 mol/L, the concentration of hydrogen peroxide is 1.0 mol/L, cleaning is carried out for 5 min, and the cleaning temperature is 40° C.; and (8) finally cleaning and drying the silicon slice in step (6) with a hydrofluoric acid solution and DI water to obtain a textured polycrystalline silicon slice, wherein the concentration of the hydrofluoric acid solution is 2 mol/L, the cleaning time is 60 s, and the cleaning temperature is 30° C.; and the DI water cleaning time is 80 s, the cleaning temperature is 30° C., the drying time is 150 s, and the drying temperature is 80° C.

Comparative Example 4

The basic steps are the same as those of the embodiment 5, except that in step (2), the reaction is carried out in a hydrofluoric acid solution containing only inorganic ions, wherein the inorganic cations are copper ions and silver ammonium ions, and the concentration of the inorganic ions is $3.5 \times 10^{-4}$ mol/L.

The silicon slices prepared in the embodiment 5 and the comparative example 4 are sampled and treated as follows:

(1) putting the silicon slice into a tubular diffusion furnace for diffusion treatment;

(2) carrying out edge etching and dephosphorization silicon glass treatment on the diffused silicon slice;

(3) depositing a silicon nitride antireflection film 83 nm on a front surface treated in step (2) by a tubular PECVD method;

(4) printing a back electrode and an aluminum back field on a back surface, and printing a grid line on the front surface of the silicon slice; and (5) sintering to test the electrical properties of a battery piece.

The silicon slices prepared in the embodiment 5 and the comparative example 4 are tested for reflectivity and electrical properties. Results obtained are shown in Table 7 and Table 8.

TABLE 7

Reflectivity table of silicon slices prepared in embodiment 5 and comparative example 4

| Embodiment | Properties Average reflectivity (%) (300-1100 nm) |
|---|---|
| Embodiment 5 | 16.55 |
| Comparative example 4 | 21.89 |

TABLE 8

Electrical properties table of silicon slices prepared in embodiment 5 and comparative example 4

| Embodiment | Open-circuit voltage (V) | Short-circuit current (A) | Series resistance (Ω) | Parallel resistance (Ω) | Fill factor (%) | Conversion efficiency (%) |
|---|---|---|---|---|---|---|
| Embodiment 5 | 0.6426 | 8.869 | 452 | 1.36 | 79.96 | 18.78 |
| Comparative example 4 | 0.6347 | 8.712 | 589 | 1.43 | 79.54 | 18.46 |

Figure 16:
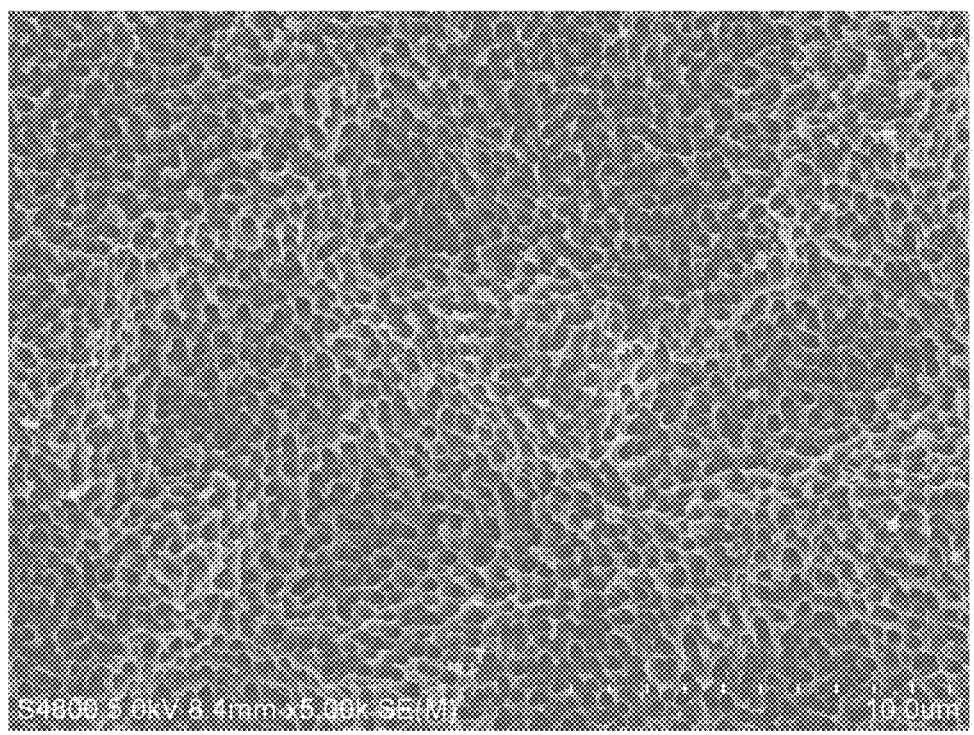
FIG. 16 is a surface scanning electron microscope (SEM) diagram taken after texturing of a diamond wire cut polycrystalline silicon slice in an embodiment 5 of the present invention.

As can be seen from Table 7, Table 8 and FIG. 16, the textured polycrystalline silicon slice prepared in the embodiment 5 of the present invention has low surface reflectivity and high photoelectric conversion efficiency, and the pore diameter of the textured structure is 400-500 nm, while the step of depositing metal particles in the comparative example 4 does not contain organic molecules, the reflectivity is higher than that of the polycrystalline silicon slice prepared in the embodiment 5, and the conversion efficiency of the prepared battery piece is lower than that of the battery piece prepared in the embodiment 5. It can be seen that organic molecules can stabilize a metal ion deposition solution and make the deposition of the metal particles on the surface of the silicon slice more uniform. Therefore, better textured polycrystalline silicon slices can be obtained by adding organic molecules into the deposited metal ions.

Embodiment 6

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 8% during surface treatment, the alkali reaction control agent is polyethylene glycol monomethyl ether with a concentration of 1.0%, the treatment temperature is 60° C., and the treatment time is 3 min; and during cleaning, the volume ratio of hydrofluoric acid to the nitric acid solution is 3:1, the treatment temperature is 30° C., and the treatment time is 3 min;

(2) taking out the cleaned silicon slice, and immersing the silicon slice into a hydrofluoric acid solution containing inorganic ions and organic molecules for reaction, wherein the inorganic cations are copper ions and silver ions, the inorganic anions are chloroauric acid ions, the concentration of the inorganic ions is $1\times10^{-6}$ mol/L, the organic molecules are ethanol, citric acid and glucose, the concentration of the organic molecules is $1\times10^{-4}$ mol/L, the concentration of hydrofluoric acid is 3 mol/L, the reaction temperature is 20° C., and the reaction time is 5 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 0.8 mol/L, and the reaction time is 50 s;

(4) taking out the silicon slice after reaction, and immersing the silicon slice into a mixed solution of hydrofluoric acid, hydrogen peroxide and a pore-forming regulator to carry out pretreatment on the surface of the silicon slice, wherein the concentration of hydrofluoric acid is 4 mol/L, the concentration of hydrogen peroxide is 1.0 mol/L, the concentration of the pore-forming regulator is 0.1%, the pore-forming regulator is a mixed additive of sodium alginate and sodium cellulose, the pretreatment time is 60 s, and the temperature is 80° C.;

(5) cleaning the pretreated silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution used in cleaning is 3:1, the cleaning temperature of the mixed acid solution is 30° C., and the time is 3 min; and during texturing, the concentration of nitric acid used is 4.0 mol/L, the concentration of hydrofluoric acid is 1.5 mol/L, the texturing time is 30 s, and the texturing temperature is 40° C.;

(6) taking out the textured silicon slice and immersing the silicon slice into a potassium hydroxide solution for initial cleaning, wherein the concentration of the potassium hydroxide solution is 5%, cleaning is carried out for 30 s, and the cleaning temperature is 25° C.;

(7) immersing the silicon slice into a mixed aqueous solution of ammonia water and hydrogen peroxide, wherein the concentration of ammonia water is 2.0 mol/L, the concentration of hydrogen peroxide is 2.0 mol/L, cleaning is carried out for 2 min, and the cleaning temperature is 30° C.; and (8) finally cleaning and drying the silicon slice in step (6) with a hydrofluoric acid solution and DI water to obtain a textured polycrystalline silicon slice, wherein the concentration of the hydrofluoric acid solution is 2 mol/L, the cleaning time is 60 s, and the cleaning temperature is 30° C.; and the DI water cleaning time is 80 s, the cleaning temperature is 30° C., the drying time is 150 s, and the drying temperature is 80° C.

Embodiment 7

In the present invention, a P-type 156 polycrystalline silicon slice cut by a diamond wire is used as a matrix material, and the following steps are carried out for texturing:

(1) immersing the diamond wire cut polycrystalline silicon slice into a sodium hydroxide solution for surface treatment, adding an alkali reaction control agent at the same time, removing a cutting damaged layer on a surface of the silicon slice, then taking out the silicon slice, and immersing the silicon slice into a mixed acid solution containing a hydrofluoric acid solution and a nitric acid solution for cleaning, wherein the concentration of the sodium hydroxide solution is 8% during surface treatment, the alkali reaction control agent is hexadecyl trimethyl ammonium chloride with a concentration of 0.75%, the treatment temperature is 60° C., and the treatment time is 3 min; and during cleaning, the volume ratio of hydrofluoric acid to the nitric acid solution is 3:1, the treatment temperature is 30° C. and the treatment time is 3 min;

(2) taking out the cleaned silicon slice and immersing the silicon slice into a hydrofluoric acid solution containing inorganic ions and organic molecules for reaction, wherein the inorganic cations are copper ions and silver ammonium ions, the inorganic anions are nitrate ions, the concentration of the inorganic ions is $3\times10^{-4}$ mol/L, the organic molecules are ethanol, the concentration of the organic molecules is $1\times10^{-3}$ mol/L, the concentration of hydrofluoric acid is 3 mol/L, the reaction temperature is 20° C., and the reaction time is 300 s;

(3) immersing polycrystalline silicon with deposited metal particles into a mixed solution of hydrofluoric acid, and further making deposition on the surface of the silicon slice uniform by means of the inorganic ions and the organic molecules brought in by a reaction tank, wherein the concentration of hydrofluoric acid is 0.1 mol/L, and the reaction time is 120 s;

(4) taking out the silicon slice after reaction, and immersing the silicon slice into a mixed solution of hydrofluoric acid, hydrogen peroxide and a pore-forming regulator to carry out pretreatment on the surface of the silicon slice, wherein the concentration of hydrofluoric acid is 4 mol/L, the concentration of hydrogen peroxide is 1.0 mol/L, the concentration of the pore-forming regulator is 0.8%, the pore-forming regulator is glucosamine, the pretreatment time is 600 s, and the temperature is 10° C.;

(5) cleaning the pretreated silicon slice by mixed acid of a hydrofluoric acid solution and a nitric acid solution, then taking out the silicon slice, and immersing the silicon slice into a mixed acid solution of hydrofluoric acid and nitric acid for texturing of the surface of the silicon slice, wherein the volume ratio of the hydrofluoric acid solution to the nitric acid solution used in cleaning is 3:1, the cleaning temperature of the mixed acid solution is 30° C., and the time is 3 min; and during texturing, the concentration of nitric acid used is 4.0 mol/L, the concentration of hydrofluoric acid is 1.5 mol/L, the texturing time is 30 s, and the texturing temperature is 40° C.;

(6) taking out the textured silicon slice and immersing the silicon slice into a potassium hydroxide solution for initial cleaning, wherein the concentration of the potassium hydroxide solution is 5%, cleaning is carried out for 30 s, and the cleaning temperature is 25° C.;

(7) immersing the silicon slice into a mixed aqueous solution of ammonia water and hydrogen peroxide, wherein the concentration of ammonia water is 2.0 mol/L, the concentration of hydrogen peroxide is 2.0 mol/L, cleaning is carried out for 2 min, and the cleaning temperature is 30° C.; and (8) finally cleaning and drying the silicon slice in step (6) with a hydrofluoric acid solution and DI water to obtain a textured polycrystalline silicon slice, wherein the concentration of the hydrofluoric acid solution is 2 mol/L, the cleaning time is 60 s, and the cleaning temperature is 30° C.; and the DI water cleaning time is 80 s, the cleaning temperature is 30° C., the drying time is 150 s, and the drying temperature is 80° C. The silicon slices prepared in the embodiment 6 and the embodiment 7 are tested for reflectivity and electrical properties. Results obtained are shown in Table 9 and Table 10.

TABLE 9

Reflectivity table of silicon slices prepared in embodiment 6 and embodiment 7

| Embodiment | Properties Average reflectivity (%) (300-1100 nm) |
|---|---|
| Embodiment 6 | 17.89 |
| Embodiment 7 | 19.64 |

TABLE 10

Electrical properties table of silicon slices prepared in embodiment 6 and embodiment 7

| Embodiment | Properties | | | | | |
|---|---|---|---|---|---|---|
| | Open-circuit voltage (V) | Short-circuit current (A) | Series resistance ($\Omega$) | Parallel resistance ($\Omega$) | Fill factor (%) | Conversion efficiency (%) |
| Embodiment 6 | 0.6391 | 8.819 | 546 | 1.64 | 79.78 | 18.54 |
| Embodiment 7 | 0.6405 | 8.864 | 391 | 1.89 | 79.93 | 18.65 |

As can be seen from Table 9 and Table 10, the textured polycrystalline silicon slice prepared by the invention has low surface reflectivity and high photoelectric conversion efficiency.

Embodiment 8

Eight parallel experiments are designed, and the basic steps are the same as those of the embodiment 3, except that the concentrations of silver ions in step (2) are 0.000001 mol/L, 0.00001 mol/L, 0.0001 mol/L, 0.001 mol/L, 0.005 mol/L, 0.01 mol/L, 0.05 mol/L, and 0.06 mol/L respectively. The silicon slices prepared respectively were tested for reflectivity and electrical properties. Results obtained are shown in Table 11.

TABLE 11

Properties comparison table of textured polycrystalline silicon slices prepared with different concentrations of silver ions

| Properties | Group number | | | | | | | |
|---|---|---|---|---|---|---|---|---|
| | 1 | 2 | 3 | 4 | 5 | 6 | 7 | 8 |
| Concentration of silver ions (mol/L) | 1E−6 | 1E−5 | 1E−4 | 5E−4 | 1E−3 | 1E−2 | 0.05 | 0.06 |
| Average reflectivity (%) (300-1100 nm) | 19.2 | 19.4 | 20.5 | 18.2 | 18.46 | 20.65 | 20.51 | 22.63 |
| Open-circuit voltage (V) | 0.625 | 0.628 | 0.629 | 0.639 | 0.628 | 0.625 | 0.621 | 0.610 |
| Short-circuit current (A) | 8.760 | 8.774 | 8.882 | 8.920 | 8.879 | 8.645 | 8.42 | 8.312 |
| Series resistance ($\Omega$) | 443 | 456 | 478 | 326 | 426 | 389 | 378 | 498 |
| Parallel resistance ($\Omega$) | 1.79 | 1.72 | 1.63 | 1.43 | 1.54 | 1.63 | 1.88 | 1.94 |
| Fill factor (%) | 79.78 | 79.81 | 79.84 | 79.97 | 79.88 | 79.85 | 79.78 | 79.67 |
| Conversion efficiency (%) | 18.41 | 18.62 | 18.74 | 18.80 | 18.73 | 18.61 | 18.54 | 18.22 |

Table 11 shows different reflectivity and electrical property data obtained when metal silver ions with different concentrations are deposited on the diamond wire cut polycrystalline silicon slice. When the concentration of the silver ions is 5E-4 mol/L, the photoelectric conversion efficiency of the prepared battery piece is the highest, while when the concentration of the silver ions exceeds the concentration range of inorganic ions defined by the present invention, that is, 0.06 mol/L, the photoelectric conversion efficiency of the prepared battery piece is low. This is because after the metal ions are deposited, pores will be formed in the surface of the polycrystalline silicon, and depositing a proper amount of silver ions can promote the pore-forming reaction. However, once the concentration of the silver ions is too high, the reaction rate will increase, the depth of pores formed in the surface of the polycrystalline silicon will increase, and the structure of the textured slice obtained after texturing will become deeper, making the subsequent coating process difficult to implement. On the contrary, if the concentration of the silver ions is less than 5E-4 mol/L, the subsequent pore-forming reaction rate will be slow, which will also affect the pore diameter of the textured surface, and the efficiency of the prepared battery piece is lower than that of the battery piece prepared in the embodiment 3. Therefore, by combining the process conditions used in the pore-forming and texturing steps of the invention, when the concentration of the metal silver ions is 5E-4 mol/L, the diamond wire cut textured polycrystalline silicon slice with low reflectivity, uniform color difference and high photoelectric conversion efficiency can be obtained; and meanwhile, verified by other embodiments of the present invention, when the concentration of the metal ions is more than or equal to 1E-6 M and less than or equal to 0.05 M, textured polycrystalline silicon slices with high quality can be obtained.

What is claimed is:

1. A texturing method for a diamond wire cut polycrystalline silicon slice, characterized by comprising the following steps:
   (1) a first procedure: immersing the diamond wire cut polycrystalline silicon slice into a mixed aqueous solution of an alkali solution and an alkali reaction control agent, and removing a damaged layer on a surface of polycrystalline silicon to form a silicon slice convex microstructure; the alkali reaction control agent comprises a mixture of polycarboxylic acid, isooctyl polyoxyethylene ether phosphate, and -allyl alcohol polyoxyalkyl ether; or a mixture of polycarboxylic acid and polyethylene glycol;
   (2) a second procedure: immersing the polycrystalline silicon slice with the convex microstructure into a hydrofluoric acid solution containing inorganic ions and organic molecules to deposit metal particles on the surface of the silicon slice;
   (3) a third procedure: forming pores in the prepared silicon slice in a mixed solution containing a pore-forming regulator, hydrofluoric acid and hydrogen peroxide; the pore-forming regulator comprises one or more of glucuronic acid, galacturonic acid, fatty acid amide, fatty alcohol polyoxyethylene ether, sodium alginate, sodium cellulose, glucosamine, sodium carboxylate, octadecatrienoic acid or oleic acid; and
   (4) a fourth procedure: after cleaning the silicon slice, texturing the surface of the silicon slice by a mixed acid solution of hydrofluoric acid and nitric acid.

2. The texturing method for the diamond wire cut polycrystalline silicon slice according to claim 1, characterized in that in step (1), the concentration of the alkali reaction control agent is 0.1-1.0%.

3. The texturing method for the diamond wire cut polycrystalline silicon slice according to claim 1, characterized in that in step (2), the inorganic ions include inorganic cations and inorganic anions, wherein the inorganic cations are one or more of copper ions, silver ions and silver ammonium ions, and the inorganic anions are chloroauric acid ions and/or nitrate ions.

4. The texturing method for the diamond wire cut polycrystalline silicon slice according to claim 1, characterized in that in step (2), the concentration of the inorganic ions is $1\times10^{6}$–$5\times10^{-2}$ mol/L.

5. The texturing method for the diamond wire cut polycrystalline silicon slice according to claim 1, characterized in that in step (2), the organic molecules are one or more of methanol, ethanol, polyethylene glycol, formic acid, acetaldehyde, vitamin C, citric acid, glucose, methylamine or ethylenediamine.

6. The texturing method for the diamond wire cut polycrystalline silicon slice according to claim 1, characterized in that in step (2), the concentration of the organic molecules is $1\times10^{4}$–$5\times10^{-2}$ mol/L.

7. The texturing method for the diamond wire cut polycrystalline silicon slice according to claim 1, characterized in that in step (3), the concentration of the pore-forming regulator is 0.1-1.0%.

8. The texturing method for the diamond wire cut polycrystalline silicon slice according to claim 1, characterized in that in step (4), the concentration of the hydrofluoric acid is 1.5-5 mol/L, and the concentration of the nitric acid is 4-7 mol/L.

* * * * *